United States Patent [19]

Nilsson

[11] Patent Number: 4,547,740
[45] Date of Patent: Oct. 15, 1985

[54] MONITORING DEVICE FOR INTEGRATED DRIVE AMPLIFIERS

[75] Inventor: Kurt A. I. Nilsson, Åkersberga, Sweden

[73] Assignee: Telefonaktiebolaget LM Ericsson, Stockholm, Sweden

[21] Appl. No.: 594,371

[22] Filed: Mar. 28, 1984

[51] Int. Cl.⁴ ............................................. G01R 19/00
[52] U.S. Cl. ........................................ 330/2; 330/298; 330/207 P
[58] Field of Search .................. 330/2, 207 P, 298; 307/200 A

[56] References Cited

U.S. PATENT DOCUMENTS 4,288,831 9/1981 Dolikian ..................... 307/200 A

Primary Examiner—James B. Mullins
Assistant Examiner—G. Wan
Attorney, Agent, or Firm—Roberts, Spiecens & Cohen

[57] ABSTRACT

A monitoring device in integrated drive amplifiers intended to be driven by digital signals includes fault detection circuits giving a fault signal for such as excess temperature, overcurrent, or interruption and shortcircuiting in the load circuit. The input of the drive amplifier is connected to the output of a D-type flipflop (13) having a data input (D) and a clock input (C) intended for connection to a digital control system. Between the data input (D) and a potential corresponding to a logical ZERO there is connected a circuit (22,23) adapted for connecting the data input (D) to said potential during the interval between the operation signals when a fault signal is present.

9 Claims, 2 Drawing Figures

MONITORING DEVICE FOR INTEGRATED DRIVE AMPLIFIERS

TECHNICAL FIELD

The invention relates to a monitoring device for drive amplifiers, particularly such as are considered as being driven by a digital control system, e.g. one controlled by a microprocessor.

BACKGROUND ART

In many technical applications, control signals are sent, e.g. from a microprocessor, to operating means such as soleonid valves, relays, lamp displays and the like, driven by a power amplifier. For monitoring the operation of the power amplifier and operating means, special contacts and feed back wiring to the digital system are presently employed. These systems are complicated and expensive, particularly when a large number of operating means are connected.

DISCLOSURE OF INVENTION

The device in accordance with the invention enables a simple feed back of the drive amplifier state without extra wiring, and the distinguishing features of the invention are apparent from the appended claim.

DESCRIPTION OF FIGURES

The invention will now be described in detail in conjunction with the accompanying drawing, whereon

MODE FOR CARRYING OUT THE INVENTION

Figure 1:
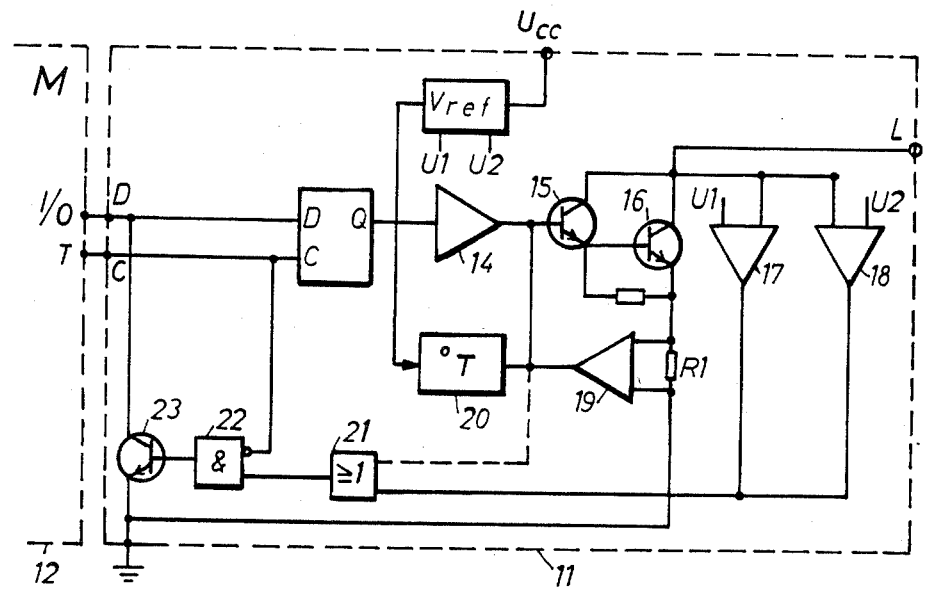
FIG. 1 is a block diagram of a drive amplifier.

The numeral 11 in FIG. 1 denotes a drive amplifier in monolithic, integrated implementation. The input on the amplifier is connected to computer equipment 12, and its output to an unillustrated load, coupled between the terminals L and a current source such as that denoted by $U_{cc}$. The amplifier is provided with a D-type flipflop 13 with its D input connected to an output (I/O) on the data processing equipment common to both input and output signals. A control or clock input C is connected to a timing circuit in the computer equipment, and at uniform intervals the latter sends control or clock pulses. The output on the D-type flipflop 13 is connected to an amplifier stage 14, which in turn feeds a Darlington-type output stage including transistors 15 and 16. The load is coupled into the collector circuit between the output L and current supply $U_{cc}$. Since the circuit should operate at different supply voltages there is a voltage reference $V_{ref}$, for generating the bias voltages necessary for different functions.

The circuit is provided with a plurality of protective and monitoring functions to ensure reliable function and protection against overloading. A temperature-sensitive circuit 20 indicates when the semiconductor chip temperature exceeds a given limiting value, e.g. 140° C., in such a case causing the bias voltage on the transistor 15 to decrease, whereby the load current is cut off partly or completely. The transistor 15 is once again given full bias voltage at another, lower temperature such as 75° C. The current passing through the final transistor 16 in the Darlington stage is sensed by the resistor R1 in the transistor emitter circuit. The potential drop in this resistance is amplified in the Schmitt trigger-type amplifier 19. When the current in the final transistor reaches the maximum permitted value, the current is limited to this value in the Darlington stage.

A third monitoring action takes place with the aid of comparators 17 and 18, which sense, with the aid of reference voltage U1 and U2 from $U_{ref}$, whether the collector voltage in the transistor 16 has a normal saturation voltage value. If this value deviates from the normal one due to interruption or shortcircuiting in the load circuit, a signal is obtained from one of the comparators 17,18. This signal, the excess temperature signal from the temperature-sensing circuit 20 and the signal from the overcurrent indicator 19 are taken to an OR gate 21, the output of which is energised as soon as one of the above-mentioned protective functions is activated. The output from the OR circuit is connected to an input on the AND circuit 22, which furthermore has an inverting input connected to the C input on the D-type flipflop 13. The output of the AND circuit is connected to the base on the transistor 23, which has its collector-emitter circuit connected between the D input on the D-type flipflop and ground. When any of the protective functions is activated and the control signal C is low, the transistor 23 becomes conductive and puts the D input at ground potential, which represents a logical zero.

The operation of the device will now be described in conjunction with the pulse diagram of FIG. 2. If the input/output (I/O) of the computer system has applied to it a signal corresponding to a logical ONE, the D-type flipflop will be set in its ONE state, and the amplifier will feed current through the load as soon as a control pulse C occurs on the output T of the data processing system. The change-over takes place at the trailing flank of the control pulse. The control pulses may consist of clock pulses, for example. When the D flipflop has been set, it remains in the position set until the level on the D input changes, when the flipflop is then reset at the trailing edge of the next control pulse, as illustrated at the time t2 in FIG. 2.

As described above, a fault signal from the AND gate 22 is only obtained when the control signal is low. The reason for this is that the D input connection to the low level through the transistor 23 must not disturb other functions.

The fault signal provides the possibility of enabling the D input to function, between the control pulses C, as a current sink, due to the transistor 23 becoming saturated. The data processing system may then easily test if there is a fault signal present. In this case it senses a logical ZERO independent of whether a logical ONE has been fed to the D flipflop during the control pulse or not.

Figure 2:
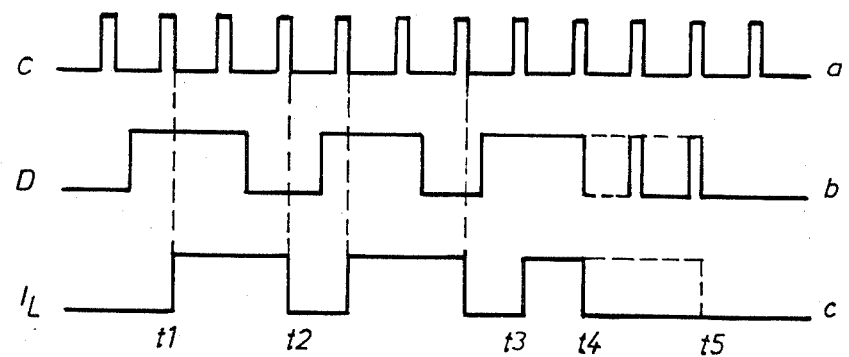
FIG. 2 is a pulse diagram.

An example is illustrated in the pulse diagram of FIG. 2. The output current $I_L$ connected in at the instant t3 would endure until time t5, when the D flipflop is set to zero, if nothing has happened. At the time t4 there is an interruption in the load, for instance, and the current $I_L$ ceases. The fault circuit comes into action, and in the pauses between the control pulses C the D input is urged down to zero level. If the output signal from the computer system still commands a ONE setting of the D flipflop, attempts are made during the following control pulses once again to put the D flipflop in the ONE state, but as long as the cause of the fault remains the circuit continues to signal "fault" by putting the D input to ground potential.

The computer system can treat the obtained fault signals in different ways, e.g. by breaking off an order in progress regarding connection of the load. It can also perform timed monitoring, which may be appropriate when the load is filament lamps, for example. When they are connected they cause a rush of current resulting in that the current limitation described above comes into action. A fault signal is obtained, but the D-type flipflop is kept triggered all the time by the D input having a ONE signal during the operation pulse. When the filaments are heated up the load current returns to a normal value and the fault signal ceases. Should the signal not cease within the normal heating-up time, this means that there is a great probability of a filament rupture, and the computer gives an alarm to this effect.

In the illustrated circuit, fault signal feed back to the D input of the flipflop 13 are provided in response to four different parameters: excess temperature, overcurrent, shortcircuited or interrupted load. The signal may of course depend on merely one, or some, of these parameters, e.g. shortcircuiting or interruption of the load circuit. The selection of one or more parameters can be brought about by such as a simple mask alteration during manufacture of the integrated amplifier, or by melting away connection bridges in a standard circuit.

The load is connected into the collector circuit in the illustrated circuit, but it can naturally be connected into the emitter circuit without any great changes in the monitoring circuits.

I claim:

1. In a system wherein a digital controller controls via a single data line a driver amplifier whose output is connected to a load and wherein the digital controller further includes a source of clock pulses, apparatus for presenting an indication of a fault in the driver amplifier-load combination to the single data line comprising a D-type flip-flop having a D-data input connected to said data line for receiving control signals from the digital controller, a C- clock input connected to the source of clock pulses, and an output connected to the driver amplifier, a fault detection means for detecting a fault in the driver amplifier-load combination, and a logic means connecting said fault detection means to said data line and responsive to the clock pulses for applying a particular voltage level representing a particular logic value when said fault detection means detects a fault to the data line only during the times between clock pulses.

2. The apparatus of claim 1 wherein said logic means comprises a digital switch means having a control input and output terminals interconnecting the data line to a reference voltage source having said particular voltage level.

3. The apparatus of claim 2 wherein said logic means further comprises a logic and function means having a first input connected to the source of clock pulses, a second input connected to said fault detecting means and an output connected to said digital switch means.

4. The apparatus of claim 3 wherein said digital switch means comprises a transistor having an emitter-collector path connected between the data line and said reference voltage source.

5. The apparatus of claim 1 wherein said fault detection means comprises means for detecting an excessive current.

6. The apparatus of claim 5 wherein said fault detection means comprises means for detecting an overvoltage.

7. The apparatus of claim 5 wherein said fault detection means comprises means for detecting an interruption in the load.

8. The apparatus of claim 5 wherein said fault detection means comprises means for detecting a short circuit in the load.

9. The apparatus of claim 5 wherein said fault detection means comprises means for detecting an excessive temperature in the driver amplifier-load combination.

* * * * *